United States Patent [19]

Takemoto et al.

[11] Patent Number: 5,228,048
[45] Date of Patent: Jul. 13, 1993

[54] SEMICONDUCTOR LASER DEVICE

[75] Inventors: Akira Takemoto; Etsuji Omura, both of Itami, Japan

[73] Assignee: Mitsubishi Denki Kabushiki Kaisha, Tokyo, Japan

[21] Appl. No.: 830,848

[22] Filed: Feb. 4, 1992

[30] Foreign Application Priority Data

Apr. 16, 1991 [JP] Japan .................................. 3-112539

[51] Int. Cl.$^5$ .............................................. H01S 3/19
[52] U.S. Cl. ......................................... 372/46; 372/45
[58] Field of Search ..................................... 372/46, 45

[56] References Cited

U.S. PATENT DOCUMENTS

| 4,849,372 | 7/1989 | Takemoto | 437/129 |
| 4,977,568 | 12/1990 | Yamamoto et al. | 372/45 |
| 4,984,244 | 1/1991 | Yamamoto et al. | 372/45 |
| 5,042,049 | 8/1991 | Ohtoshi et al. | 372/45 |
| 5,111,469 | 5/1992 | Narui et al. | 372/45 |
| 5,148,439 | 9/1992 | Wünstel et al. | 372/46 |

OTHER PUBLICATIONS

Prescript of 20th Meeting of Japanese Society of Applied Physics, 1982, p. 155.

Prescript of 33rd Meeting of Japanese Society of Applied Physics, 1986, p. 158.

Primary Examiner—Léon Scott, Jr.
Attorney, Agent, or Firm—Leydig, Voit & Mayer

[57] ABSTRACT

A semiconductor laser device includes a p type semiconductor substrate, an active layer having a smaller energy band gap than the p type semiconductor substrate and an n type semiconductor layer having a larger energy band gap than the active layer successively formed on the p type semiconductor substrate, a mesa formed by selectively etching the semiconductor substrate, active layer, and n type semiconductor layer, p-n-p layers having larger energy band gaps than the active layer and disposed at both sides of the mesa, a small energy band gap layer having a smaller energy band gap than the p type semiconductor substrate and disposed on the p-n-p layers, and an n type semiconductor layer disposed on the small energy band gap layer and on the n type semiconductor layer. The small energy band gap layers decrease the current flowing through the thyristor structure and are disposed close to the active region but in a different processing step from the formation of the active layer. A waveguide structure in which the active layer is surrounded by semiconductor layers having larger energy band gaps is realized.

13 Claims, 7 Drawing Sheets

SEMICONDUCTOR LASER DEVICE

FIELD OF THE INVENTION

The present invention relates to a semiconductor laser device, and more particularly to a semiconductor laser device that realizes high speed response and high power output at the same time and that outputs light having a far-field pattern of Gaussian distribution.

PRIOR ART

Figure 4:
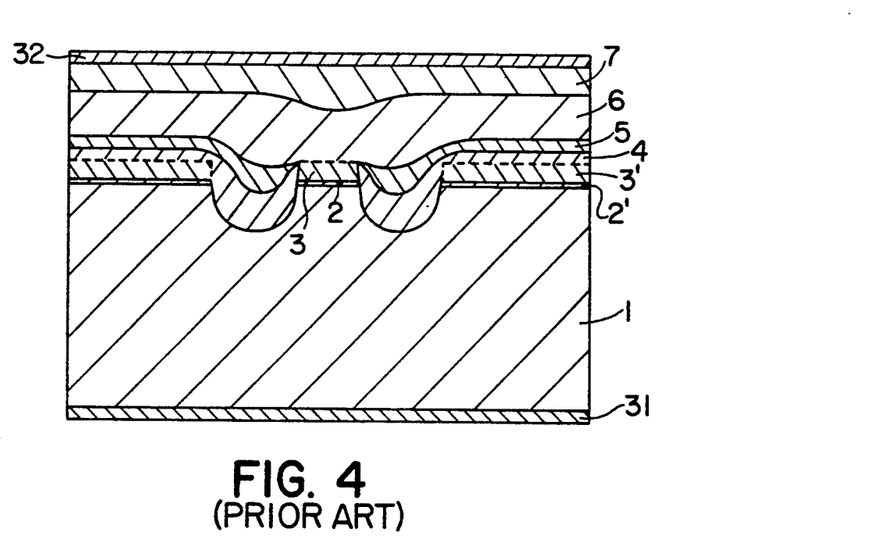
FIG. 4 is a cross-sectional view of a semiconductor laser device in accordance with a prior art.

FIG. 4 is a cross-sectional view of a prior art semiconductor laser device disclosed in Prescript of 29th Meeting of Japanese Society of Applied Physics (1982), p. 155. In FIG. 4, reference numeral 1 designates an n type InP substrate. InGaAsP layers 2 and 2' are disposed on the substrate 1. P type InP layers 3 and 3' are disposed on the layers 2 and 2', respectively. Two stripe-shaped grooves penetrate the p type InP layers 3 and 3' and the InGaAsP layers 2 and 2'. These grooves are formed by etching. A portion of the substrate 1, the InGaAsP layer 2, and the p type InP layer 3, which are between the two grooves, constitute a mesa structure. A p type InP layer 4 is disposed in the two stripe-shaped grooves and on the p type InP layer 3'. An n type InP layer 5 is disposed on the p type InP layer 4. A p type InP layer 6 is disposed on the n type InP layer 5 and on the p type InP layer 3. A p type InGaAsP contact layer 7 is disposed on the p type InP layer 6. In addition, an n side electrode 31 is disposed on the rear surface of the substrate 1 and a p side electrode 32 is disposed on the contact layer 7.

Layers 3, 3', 4, 5, and 6 comprise InP similarly as the substrate 1 and have the same energy band gap as the substrate 1. The InGaAsP layers 2 and 2' have smaller energy band gaps than the substrate 1.

A description is given of the operation. When a bias voltage in forward direction to the pn junction is applied between the substrate 1 and the contact layer 7 from the n side electrode 31 and the p side electrode 32, respectively, the holes and electrons in the respective layers are injected into the active region 2, a semiconductor having a smaller energy band gap than the substrate 1, resulting in carrier recombinations that produce laser light. In such a semiconductor laser device, in order to inject the electrons and holes into the active region 2 with high efficiency, a current blocking structure is produced by the p-n-p-n thyristor comprising the p type semiconductor 6, n type semiconductor 5, p type semiconductors 3 and 4, and n type semiconductor 1. However, in this thyristor structure, when the voltage applied to the laser device is increased to increase the light output, the voltage applied to the thyristor structure increases and the current corresponding to the gate current increases, whereby the current flowing through the thyristor structure suddenly increases. As a result, the light output is not so large. On the other hand, in the structure shown in FIG. 4, since the semiconductor layer 2' having a small energy band gap is included in the thyristor structure, the gain of the n-p-n structure transistor constituting the thyristor decreases, so that less current flows through the thyristor structure as compared with a thyristor structure having no semiconductor layer 2'. Therefore, a large output of light can be obtained.

Figure 5:
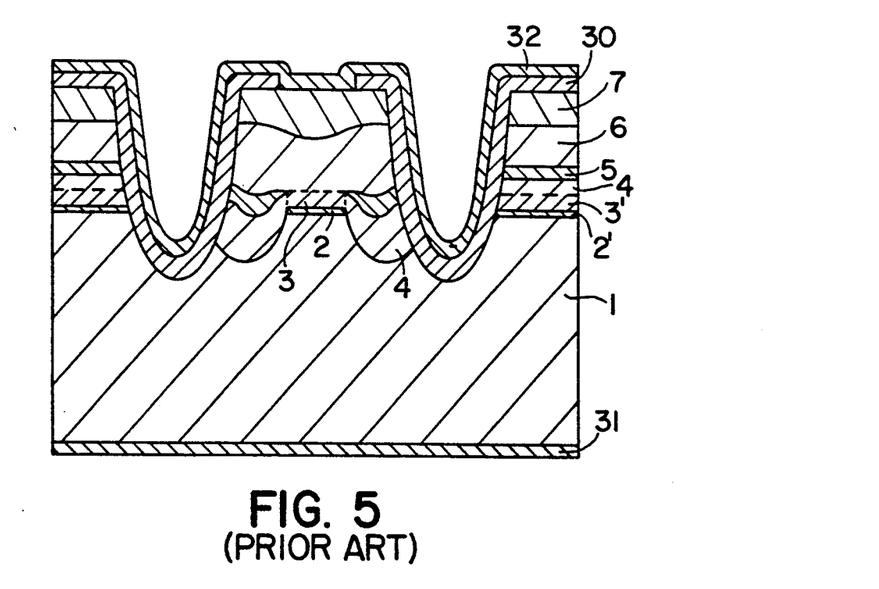
FIG. 5 is a cross-sectional view showing a variation of the semiconductor laser device of FIG. 4 including a mesa structure to reduce parasitic capacitance.

However, in this structure, since the active layer 2 and the semiconductor layer 2' are formed at the same time, it is impossible to arbitrarily select the energy band gap of the semiconductor layer 2' to minimize the current flowing through the thyristor structure. In addition, when a semiconductor laser device performs high speed modulation, a structure shown in FIG. 5 is generally employed to decrease the parasitic capacitance of the element. In FIG. 5, stripe-shaped mesa grooves are formed at both sides of the active region from the surface of the contact layer 7 and reach into the substrate 1 and thus the whole laser element is formed into a mesa shape. In this case, if the mesa width is too narrow, the semiconductor layer 2' may be outside the mesa and the above-described current decreasing effect cannot be obtained. As a result, high speed response and high power output cannot be realized at the same time in this conventional structure.

Figure 6:
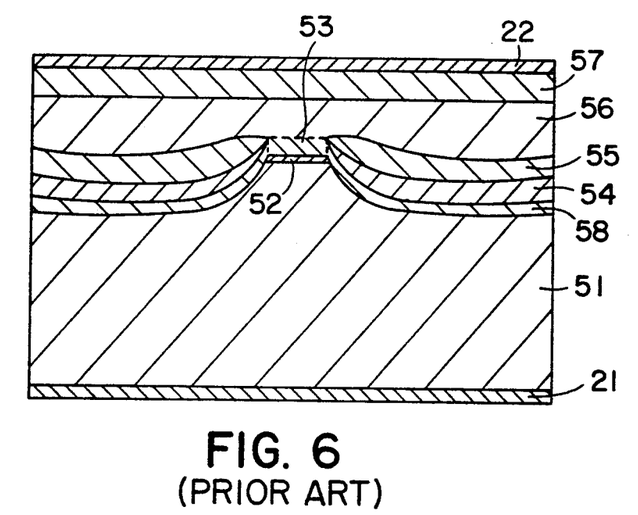
FIG. 6 is a cross-sectional view of a semiconductor laser device in accordance with another prior art.

Meanwhile, FIG. 6 is a cross-sectional view of a prior art semiconductor laser device disclosed in Prescript of 33th Meeting of Japanese Society of Applied Physics (1986), p. 158. In FIG. 6, reference numeral 51 designates an n type InP substrate. An active layer 52 is disposed on the substrate 1. A p type InP layer 53 is disposed on the active layer 52. A mesa structure is formed by etching the active layer 52, p type InP layer 53 and the substrate 51. P type InGaAsP layers 58 are disposed at both sides of the mesa structure. The energy band gap of this p type InGaAsP layer 58 is smaller than that of the substrate 1. P type InP layers 54 are disposed on the p type InGaAsP layers 58 and n type InP layers 55 are disposed on the p type InP layers 54. In addition, a p type InP layer 56 is disposed on the n type InP layers 55 and on the p type InP layer 53. A p type InGaAsP contact layer 57 is disposed on the p type InP layer 56. In addition, an n side electrode 21 is disposed on the rear surface of the substrate 51 and a p side electrode 22 is disposed on the contact layer 57.

Figure 7:
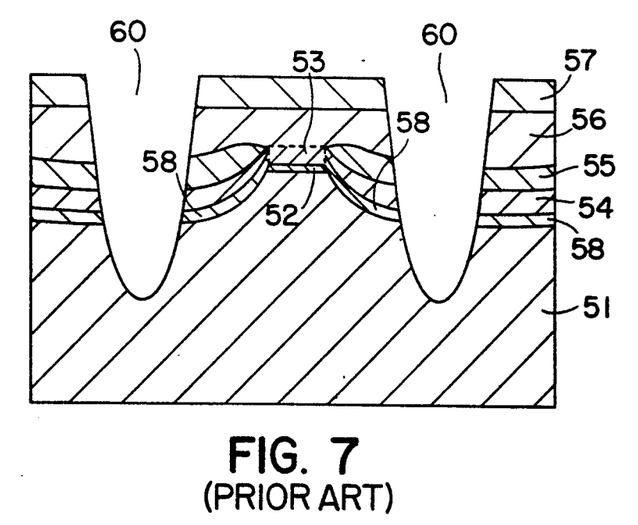
FIG. 7 is a cross-sectional view showing a variation of the semiconductor laser device of FIG. 6, in which a mesa structure is formed to reduce parasitic capacitance.

In this semiconductor laser device, the semiconductor layer 58 has fundamentally the same effect as the semiconductor layer 2' of the laser device shown in FIG. 4, so that the current flowing through the thyristor structure can be significantly decreased. In addition, since this semiconductor layer 58 is formed in a different process step from that of the active layer 52, its composition can be chosen to have an optimum energy band gap. In addition, this layer 58 is adjacent to the active layer 52. Therefore, even when a mesa structure is formed by forming grooves 60 by etching thereby to decrease the parasitic capacitance, since the semiconductor layer 58 exists in the mesa, the effect of decreasing the current flowing through the thyristor structure can be maintained.

Figure 8:
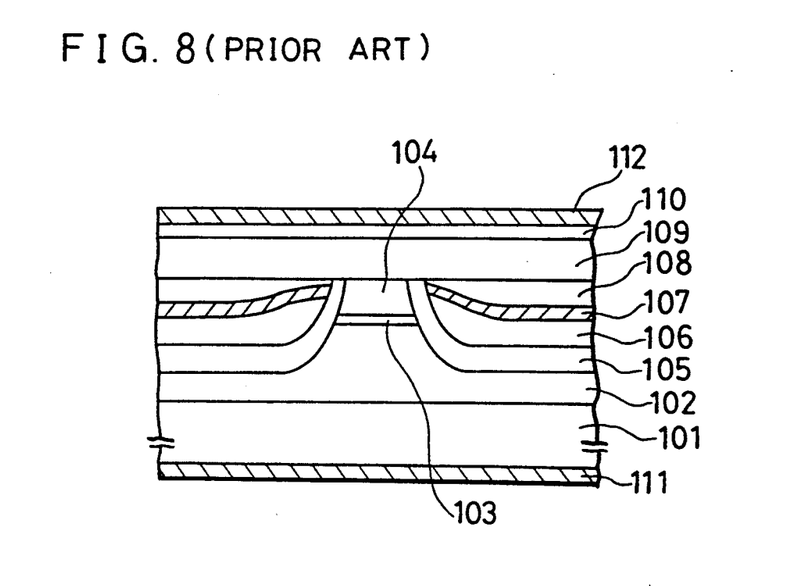
FIG. 8 is a cross-sectional view of a semiconductor laser device in accordance with the prior art.

FIG. 8 is a cross-sectional view of a prior art semiconductor laser device disclosed in Japanese Published Patent Application No. 2-143483. In FIG. 8, reference numeral 101 designates a p type InP substrate. A p type InP first cladding layer 102 is disposed on the substrate 101. An InGaAsP active layer 103 is disposed on the first cladding layer 102. An n type InP second cladding layer 104 is disposed on the active layer 103. A mesa structure is formed by etching the second cladding layer 104, active layer 103, and first cladding layer 102. P type InP first buried layers 105 are disposed at both sides of the mesa structure. N type InP second buried layers 106 are disposed on the first buried layers 105. P type InP third buried layers 107 having a high dopant impurity concentration are disposed on the second buried layers 106. P type InP fourth buried layers 108 are disposed on the third buried layers 107. An n type InP third cladding layer 109 is disposed on the second cladding layer 104 and on the fourth buried layers 108. An n type InGaAsP contact layer 110 is disposed on the third cladding layer 109. In addition, a p side electrode 111 is disposed on the rear surface of the substrate 101 and an n side electrode 112 is disposed on the contact layer 110.

Figure 9:
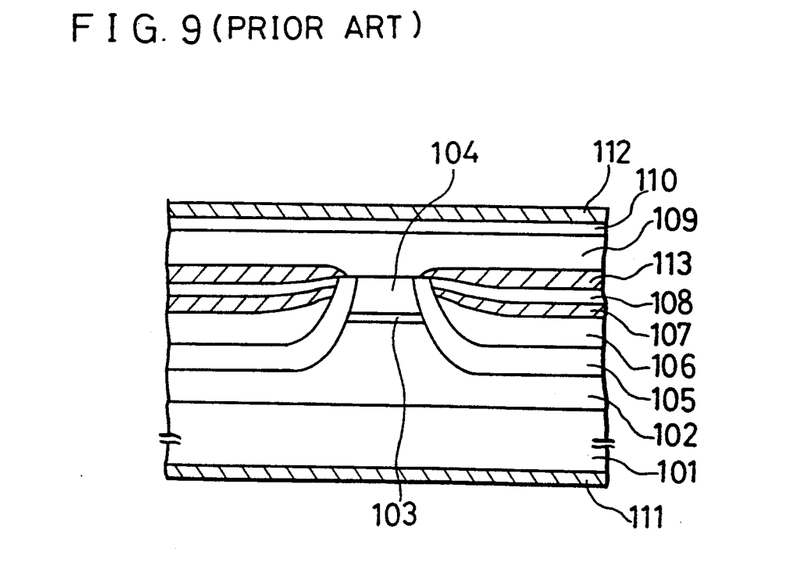
FIG. 9 is a cross-sectional view of a semiconductor laser device in accordance with the prior art.

FIG. 9 is a cross-sectional view of a prior art semiconductor laser device disclosed in Japanese Published Patent Application No. 2-143483. This laser device is similar to the device shown in FIG. 8 except that high impurity concentration p type InP fifth buried layers 113 are disposed on the p type fourth buried layers 108.

In the laser devices shown in FIGS. 8 and 9, since the high impurity concentration buried layers 107 and 113 are included, those buried layers produce a p-n-p$^+$-p-n thyristor structure (FIG. 8) or a p-n-p$^+$-p-p$^+$-n thyristor structure (FIG. 9). Therefore, during the laser operation, electrons injected into the thyristor structure are prevented from being transferred by barriers formed by the high impurity concentration buried layers and the thyristor is hard to turn on. Also in these structures, since the high impurity concentration buried layers are arranged close to the active layer, a mesa structure can be formed to reduce the parasitic capacitance.

In the prior art semiconductor laser device shown in FIG. 6 that can realize high speed response and high power output at the same time, the semiconductor layer 58 has a refractive index different from those of the semiconductor layers 51, 53, 54, 55 and 56, and current confinement in the width direction of the active region is not sufficient in the waveguide structure constituted by the active layer 52, the semiconductor layer 58 and the peripheral semiconductor layers, so that the far-field pattern of the output light does not have an ideal Gaussian distribution.

In the prior art semiconductor laser devices shown in FIGS. 8 and 9, high concentration impurity layers 107 and 113 are provided to make the thyristor hard to turn on. However, it is technically difficult to form a high carrier concentration film of good quality. In addition, in order to make the laser structures shown in FIGS. 8 and 9 effective, the high impurity concentration layers 107 and 113 are required to be as thick as about 0.5 micron or more, restricting design freedom.

SUMMARY OF THE INVENTION

It is an object of the present invention to provide a semiconductor laser device that can realize high power output without losing the effect of decreasing current flowing through the thyristor structure even when a mesa structure is employed for reducing parasitic capacitance in which the far-field pattern of the output light has a Gaussian distribution.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with the present invention, a semiconductor laser device includes a p type semiconductor substrate, an active layer comprising a semiconductor having smaller energy band gap than that of the p type semiconductor substrate and an n type semiconductor layer having larger energy band gap than that of the active layer, which are successively formed on the p type semiconductor substrate, a mesa formed by selectively etching the semiconductor substrate, active layer and n type semiconductor layer so as to leave the active layer and n type semiconductor layer in a stripe shape, p-n-p buried layers having larger energy band gaps than the active layer and disposed at opposite sides of the mesa, small energy band gap layers having smaller energy band gaps than the p type semiconductor substrate and disposed on the buried layers, and an n type semiconductor layer disposed on the small energy band gap layers and on the n type semiconductor layer. Therefore, the small energy band gap layers for decreasing the current flowing through the thyristor structure is disposed close to the active region in a different process step from that in which the active layer is formed and, furthermore, a waveguide structure in which the active layer is surrounded by semiconductor layers having large energy band gaps is realized.

DETAILED DESCRIPTION OF THE PREFERRED EMBODIMENTS

Embodiments of the present invention will be described in detail with reference to the drawings.

Figure 1A:
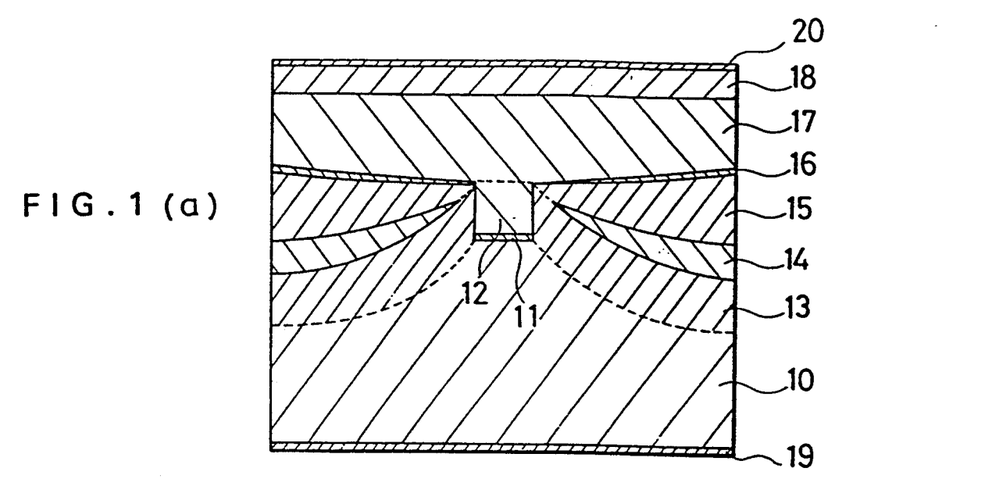
FIGS. 1(a) and 1(b) are a cross-sectional view and an equivalent circuit diagram, respectively, showing a semiconductor laser device in accordance with an embodiment of the present invention.

FIG. 1(a) is a cross-sectional view of a semiconductor laser device in accordance with a first embodiment of the present invention. In FIG. 1(a), reference numeral 10 designates a p type InP substrate. An active layer 11 comprising $In_{0.71}Ga_{0.29}As_{0.62}P_{0.38}$ which has a smaller energy band gap than the substrate 10 is disposed on the substrate 10. An n type InP layer 12 is disposed on the active layer 11. The n type InP layer 12, active layer 11 and substrate 10 are formed into mesa shape by etching and p type InP layer 13, n type InP layer 14, p type InP layer 15 and $In_{0.82}Ga_{0.18}As_{0.4}P_{0.6}$ layer 16 are successively deposited at both sides of the mesa. An n type InP layer 17 is disposed on the mesa and on the $In_{0.82}Ga_{0.18}As_{0.4}P_{0.6}$ layer 16. An n type $In_{0.82}Ga_{0.18}As_{0.4}P_{0.6}$ contact layer 18 is disposed on the n type InP layer 17. A p side electrode 19 is disposed on the rear surface of the substrate 10 and an n side electrode 20 is disposed on the contact layer 18.

Figure 2:
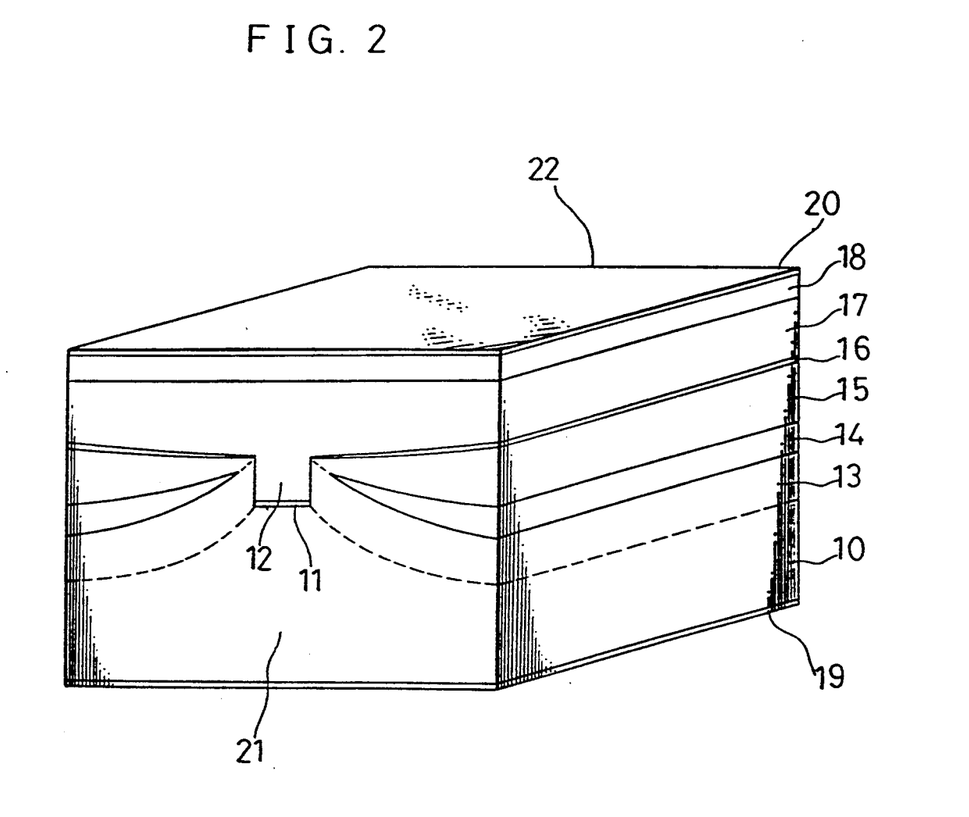
FIG. 2 is a perspective view of the semiconductor laser device of FIG. 1(a)

FIG. 2 is a perspective view of the semiconductor laser device of FIG. 1(a), in which reference numerals 21 and 22 designate cleavage facets.

Figure 3A:
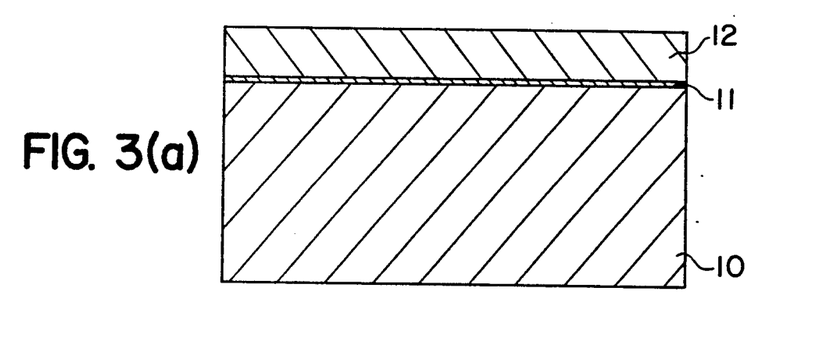
FIGS. 3(a) to 3(c) are cross-sectional views of process steps for producing the semiconductor laser device of FIGS. 1(a) and 2.
Figure 3B:
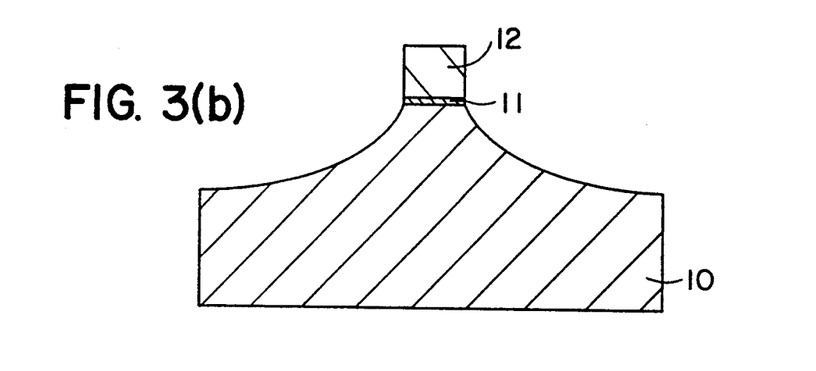
Figure 3C:
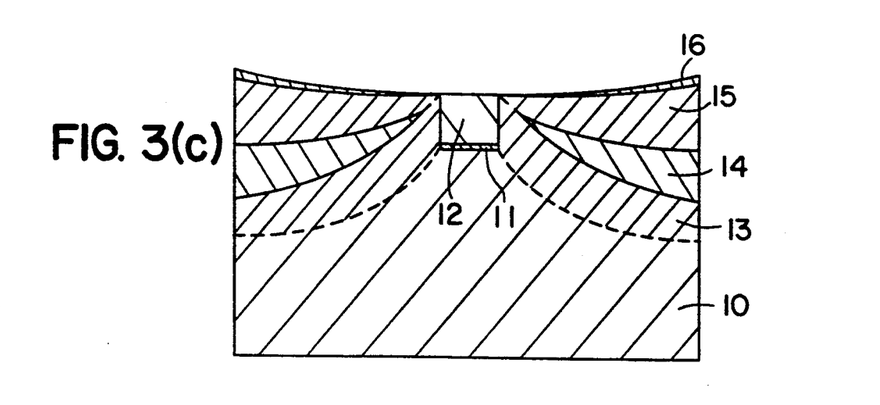

A description is given of the production method. FIGS. 3(a) to 3(c) illustrate a method for producing the semiconductor laser device shown in FIGS. 1(a) and 2. In FIGS. 3(a) to 3(c), the same reference numerals as those in FIGS. 1(a) and 2 designate the same or corresponding parts.

As shown in FIG. 3(a), an $In_{0.71}Ga_{0.29}As_{0.62}P_{0.38}$ active layer 11 of 0.1 micron thickness and an n type InP layer 12 of 1.0 micron thickness are successively grown on the p type InP layer 10 by liquid phase epitaxy (LPE), metal organic chemical vapor deposition (MOCVD) or the like. Then, as shown in FIG. 3(b), a mesa is formed over the wafer using photolithography and chemical etching. The etching depth is about 4 microns. Thereafter, as shown in FIG. 3(c), p type InP layer 13 of 1 micron thickness, n type InP layer 14 of 1.5 microns thickness, p type InP layer 15 of 1.5 microns thickness and $In_{0.82}Ga_{0.18}As_{0.4}P_{0.6}$ layer 16 of 0.1 micron thickness are successively grown by LPE so as to bury the mesa. Then, on the mesa and the $In_{0.82}Ga_{0.18}As_{0.4}P_{0.6}$ layer 16, an n type InP layer 17 of 2 microns thickness and an n type $In_{0.82}Ga_{0.18}As_{0.4}P_{0.6}$ contact layer 18 of 1.0 micron thickness are successively grown, completing the growth process. Thereafter, a p side electrode 19 is formed on the rear surface of the substrate 10 and an n side electrode 20 is formed on the contact layer 18 by sputtering. Then, resonator facets 21 and 22 are formed by cleavage, resulting in the laser device shown in FIGS. 1(a) and 2.

This laser device operates as follows. When voltage is applied to the p type semiconductor substrate 10 and the n type contact layer 18, electrons and holes are injected into the active region 11, resulting in carrier recombinations that produce laser light.

The semiconductor layers 13, 14, 15, 16 and 17 constitute a p-n-p-n structure and when a low voltage is applied, this p-n-p-n structure serves as a current blocking layer and current flows into the active region efficiently. When a high voltage is applied to increase the light output, the p-n-p-n structure is usually turned on and the current blocking effect is lost, so that the light output is not increased. In this first embodiment of the present invention, however, since the small energy band gap layer 16 has a smaller energy band gap than the substrate 10, the p-n-p-n thyristor structure is not turned on until a relatively high voltage is applied, so that high power output can be obtained.

Figure 1B:
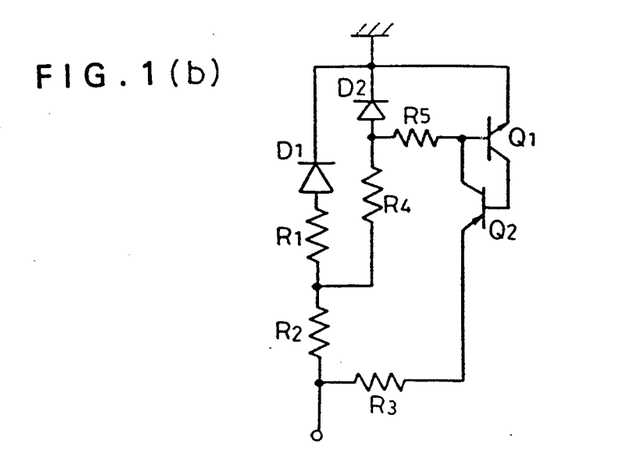

The reason why high power output operation can be attained in this embodiment will be described with reference to an equivalent circuit diagram. FIG. 1(b) shows an equivalent circuit of the semiconductor laser device of FIG. 1(a). In FIG. 1(b), a diode D1 is constituted by the p type substrate 10, active layer 11 and n type semiconductor layer 12. A diode D2 is constituted by the p type semiconductor layer 15, small energy band gap layer 16 and n type semiconductor layer 17. A PNP transistor Q1 is constituted by the p type semiconductor layer 13, n type semiconductor layer 14 and p type semiconductor layer 15. An NPN transistor Q2 is constituted by the n type semiconductor layer 14, p type semiconductor layer 15, small energy band gap layer 16 and n type semiconductor layer 17. Resistors R1 to R5 are connected to the diodes D1, D2 and transistors Q1, Q2. In this embodiment, since the small energy band gap layer 16 has a smaller energy band gap than that of the substrate 10, the characteristics of the diode D2 and the transistor Q1 change, and the current flowing through the diode D1 increases when the current flowing through the other paths decreases, resulting in high power output operation.

Figure 10:
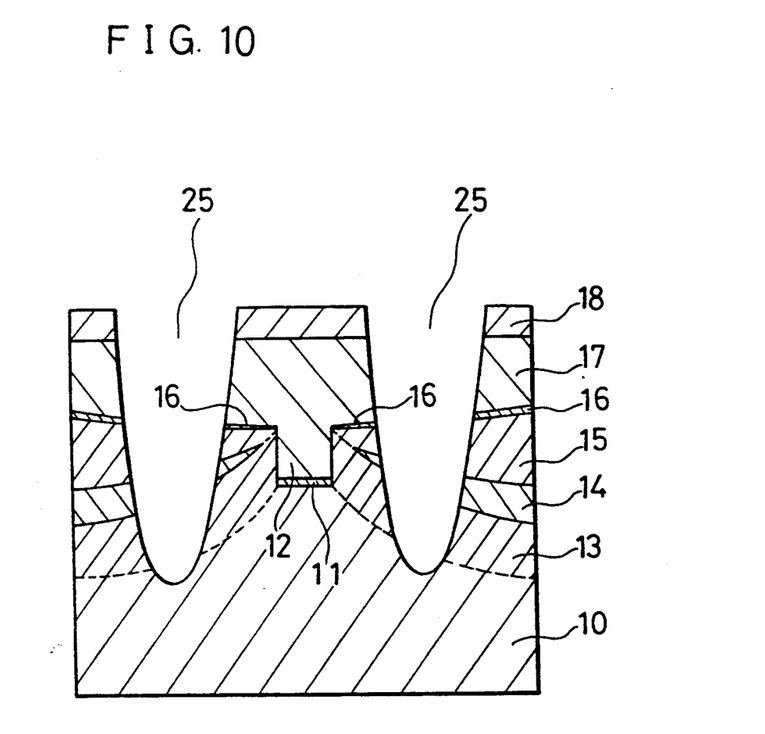
FIG. 10 is a cross-sectional view showing a variation of the semiconductor laser device shown in FIGS. 1(a) and 2 including a mesa structure to reduce parasitic capacitance.

In this laser structure, since the small energy band gap layer 16 is formed in a different process step from the process forming the active region 12, it is possible to select the energy band gap of the layer 16 to obtain the highest output power. In addition, the small energy band gap layer 16 is formed so that the ends of the layer 16 at the active region side reach the upper edges of the mesa, i.e., the ends of the layer 16 are aligned with respective edges of the active layer 11. Therefore, even when grooves 25 are formed by etching to form a mesa structure that reduces parasitic capacitance as shown in FIG. 10, the small energy band gap layers 16 are reliably inside the mesa, whereby high speed response can be realized with high power output. In addition, the small energy band gap layers 16 are spaced apart from the active region 11 and the active layer 11 is surrounded by semiconductor layers having a large energy band gap. Therefore, light is sufficiently confined in the active region 11 and a far-field pattern having an ideal Gaussian distribution can be obtained. In addition, the small energy band gap layer 16 can be easily formed as compared with the conventional high carrier concentration layers 107 and 113 shown in FIGS. 8 and 9 and a thickness of only 0.1 micron or less is enough to exhibit the effect, resulting in great merits in production and design.

While in the above-described embodiment the semiconductor layer 11 having a small energy band gap, which serves as an active layer, is formed directly on the p type semiconductor substrate 10, a buffer layer having an energy band gap the same as or different from that of the substrate 10 may be inserted between the layer 11 and the substrate 10. In this case, the energy band gaps of the respective semiconductor layers are chosen on the basis of the energy band gap of the buffer layer.

In addition, like a distributed feedback type semiconductor laser, a layer having a different energy band gap from that of the substrate 11 may be formed on or beneath the active layer 12.

As is evident from the foregoing description, according to the present invention, a semiconductor laser device includes a p type semiconductor substrate, an active layer comprising a semiconductor having a smaller energy band gap than the p type semiconductor substrate and an n type semiconductor layer having larger energy band gap than that of the active layer, which are successively formed on the p type semiconductor substrate, a mesa formed by selectively etching the semiconductor substrate active layer and n type semiconductor layer leaving the active layer and n type semiconductor layer in a stripe-shape, p-n-p buried layers having larger energy band gap than the active layer and disposed at both sides of the mesa, a small energy band gap layer having smaller energy band gap than the p type semiconductor substrate and disposed on the buried layers, and an n type semiconductor layer disposed on the small energy band gap layer and on the n type semiconductor layer. Therefore, the small energy band gap layer for decreasing the current flowing through the thyristor structure is disposed close to the active region in a different process step from the formation of the active layer and, furthermore, a waveguide structure in which the active layer is surrounded by semiconductor layers having large energy band gaps is realized. As a result, a semiconductor laser device that provides high speed response and high power output at the same time and that outputs light having a far-field pattern in a Gaussian distribution is realized.

What is claimed is:

1. A semiconductor laser device comprising:

a p type semiconductor substrate having a first energy band gap;

an active layer comprising a semiconductor material having a second energy band gap smaller than the first energy band gap and a first n type semiconductor layer having an energy band gap larger than the second energy band gap successively disposed on said p type semiconductor substrate;

a stripe shape mesa, formed by selectively etching said semiconductor substrate, active layer, and first n type semiconductor layer, including said active layer and first n type semiconductor layer;

a first p type semiconductor layer, a second n type semiconductor layer, and a second p type semiconductor layer, each having an energy band gap larger than the second energy band gap successively disposed on said semiconductor substrate at and contacting opposite sides of said mesa;

a small energy band gap layer having a third energy band gap smaller than the first energy band gap and disposed on said second p type semiconductor layer; and a third n type semiconductor layer disposed on said small energy band gap layer and on said mesa contacting said first n type semiconductor layer.

2. The semiconductor laser device of claim 1 wherein said first p type semiconductor layer, second n type semiconductor layer, second p type semiconductor layer, and third n type semiconductor layer comprises a p-n-p-n thyristor structure, said small energy band gap layer suppressing current flow through said thyristor structure.

3. The semiconductor laser device of claim 2 wherein the third energy band gap is selected to suppress the current flowing through said p-n-p-n thyristor structure.

4. The semiconductor laser device of claim 1 wherein said small energy band gap layer and said active layer are formed in different process steps.

5. The semiconductor laser device of claim 1 wherein said mesa includes opposed edges along said stripe and said small energy band gap layer includes two edges contacting respective edges of said mesa.

6. The semiconductor laser device of claim 1 wherein said small energy band gap layer is no more than 0.1 micron thick.

7. A semiconductor laser device in accordance with claim 1 wherein said semiconductor substance in a substrate.

8. The semiconductor laser device of claim 1 wherein said semiconductor substrate comprises a p type semiconductor layer disposed on a p type semiconductor substrate.

9. The semiconductor laser device of claim 8 including a p side electrode disposed on said substrate and an n side electrode disposed on said third n type semiconductor layer.

10. The semiconductor laser device of claim 1 including a p side electrode disposed on said substrate and an n side electrode disposed on said third n type semiconductor layer.

11. The semiconductor laser device of claim 1 including stripe-shaped grooves disposed on opposite sides of the mesa extending from and through said third n type semiconductor layer side and into said p type semiconductor substrate to decrease parasitic capacitance.

12. The semiconductor laser device of claim 1 wherein said p type semiconductor substrate, first p type semiconductor layer, second n-type semiconductor layer, second p type semiconductor layer, and third n type semiconductor layer are InP and said active layer and small energy band gap layer are InGaAsP.

13. The semiconductor laser device of claim 1 including an n type contact layer disposed on said third n type semiconductor layer, a p side electrode disposed on said substrate, and an n side electrode disposed on said n type contact layer.

* * * * *